United States Patent [19]

Barbee, Jr. et al.

[11] Patent Number: 5,414,588
[45] Date of Patent: May 9, 1995

[54] HIGH PERFORMANCE CAPACITORS USING NANO-STRUCTURE MULTILAYER MATERIALS FABRICATION

[75] Inventors: Troy W. Barbee, Jr., Palo Alto; Gary W. Johnson; Dennis W. O'Brien, both of Livermore, all of Calif.

[73] Assignee: The Regents of the University of California, Oakland, Calif.

[21] Appl. No.: 122,940

[22] Filed: Sep. 20, 1993

[51] Int. Cl.$^6$ ............................................ H01G 4/012
[52] U.S. Cl. ........................... 361/304; 361/313; 361/305; 361/321.1; 361/328; 361/329; 361/322
[58] Field of Search ................. 361/301.4, 303, 304, 361/305, 306.3, 308.1, 309, 311, 312, 313, 320, 321.1, 321.2, 321.3, 322, 328, 329, 330; 29/25.42

[56] References Cited

U.S. PATENT DOCUMENTS

| | | |
|---|---|---|
| 4,049,533 | 9/1977 | Golyanov et al. |
| 4,183,797 | 1/1980 | Kennedy et al. |
| 4,392,939 | 7/1983 | Crombeen et al. |
| 4,417,968 | 11/1983 | McKelvey |
| 4,421,628 | 12/1983 | Quaderer |
| 4,584,628 | 4/1986 | Cichanowski ............ 361/309 |
| 4,673,623 | 6/1987 | Gardner et al. ............ 428/620 |
| 4,870,648 | 9/1989 | Ceglio et al. ............... 372/5 |
| 4,915,463 | 4/1990 | Barbee, Jr. ................ 350/1.1 |
| 4,915,805 | 4/1990 | Rust |
| 4,930,045 | 5/1990 | Carlson et al. ............ 361/329 |
| 5,021,139 | 6/1991 | Hartig et al. |
| 5,022,978 | 6/1991 | Hensel et al. |
| 5,203,977 | 4/1993 | Makowiecki et al. |
| 5,286,361 | 2/1994 | Makowiecki et al. |

FOREIGN PATENT DOCUMENTS

| | | | |
|---|---|---|---|
| 3024711 | 2/1991 | Japan | 361/313 |
| 3200308 | 9/1991 | Japan | 361/311 |
| 3200309 | 9/1991 | Japan | 361/311 |
| 2231201 | 11/1990 | United Kingdom | 361/305 |

*Primary Examiner*—Bruce A. Reynolds
*Assistant Examiner*—Gregory L. Mills
*Attorney, Agent, or Firm*—Henry P. Sartorio; L. E. Carnahan

[57] ABSTRACT

A high performance capacitor fabricated from nano-structure multilayer materials, such as by controlled, reactive sputtering, and having very high energy-density, high specific energy and high voltage breakdown. The multilayer capacitors, for example, may be fabricated in a "notepad" configuration composed of 200–300 alternating layers of conductive and dielectric materials so as to have a thickness of 1 mm, width of 200 mm, and length of 300 mm, with terminals at each end of the layers suitable for brazing, thereby guaranteeing low contact resistance and high durability. The "notepad" capacitors may be stacked in single or multiple rows (series-parallel banks) to increase the voltage and energy density.

20 Claims, 3 Drawing Sheets

HIGH PERFORMANCE CAPACITORS USING NANO-STRUCTURE MULTILAYER MATERIALS FABRICATION

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to capacitors, particularly to high performance capacitors, and more particularly to high performance, high energy-density capacitors fabricated from nano-structure multilayer materials, and method for fabricating same.

Many pulse power and industrial applications are limited by capacitor performance. Capacitor requirements for military and scientific pulse power applications are particularly acute. The rapid discharge of a significant amount of electrical energy is used to create a variety of physical phenomena. To achieve this, high voltage, high energy density capacitor banks with good circuit performance are required. Capacitors for pulse power applications must have low loss, low inductance and be thermally and mechanically robust. The pulse power applications include electrothermal and electromagnetic propulsion, x-ray generation, and electromagnetic effects. Industrial applications include high precision instrumentation, medical instrumentation and systems, space and remote applications, and high reliability electronics.

Military and space applications have uniquely difficult survivability and reliability requirements for harsh environments. Capacitor banks need to survive and function through mechanical and thermal shock without significant mechanical degradation or chemical aging. In some cases, capacitors need to survive high radiation environments. Military applications in the field must be maintainable while remote applications in space depend on highly reliable capacitors for electrical energy storage.

New applications demand better capacitor performance than currently available. Capacitors and capacitor bank requirements include high energy density, specific energy, bank charging voltage, and efficiency. Also, about 1 Hz repetition rate and long shot file (>1000) are needed for many applications. Current state-of-the-art capacitors can achieve an energy density <1 $MJ/m^3$ and a specific energy of <0.6 KJ/Kg delivered, while requirements for a current electrothermal propulsion system, for example require: energy density of $\geq 15$ $MJ/m^3$, specific energy of $\geq 10$ KJ/Kg, bank charge voltage of 5–20 Kv, loss factor of <0.02. Such requirements are not achievable with existing capacitor technology. While incremental improvements are anticipated from existing capacitor technologies, significant advances are needed to meet these requirements.

Current capacitor technologies suffer from defects and in homogeneity introduced in the dielectric material and in capacitor manufacturing which contributes to voltage breakdown. Important voltage breakdown mechanisms include electrical or avalanche breakdown, electrochemical breakdown, and thermal breakdown as dielectric loss increases under stress and with aging.

Rolled paper-conductor or polymer-conductor capacitors are characterized by high breakdown voltage but lower dielectric constant. They suffer from material and manufacturing defects, and can fail under the mechanical and thermal shock expected of pulse power applications in military environments. They experience chemical degradation with aging, temperature and shot life. They are bulky to package and aren't expected to achieve the performance required for the pulse power applications currently being developed.

Capacitors with ferroelectric ceramic dielectrics, such as $BaTiO_3$, typically have a much higher dielectric constant than polymer-or paper-conductor capacitors. However, large geometry ceramic capacitors still have lower breakdown voltage and often high dielectric loss. Performance of the current ceramic capacitors is limited by ceramic powder quality, capacitor design, and the manufacturing process.

It is thus seen that due to the performance of the currently known capacitors, many pulse power and industrial applications are limited. While incremental improvements are anticipated from existing capacitor technologies, significant advances are needed in energy density, specific energy, life time, etc. to enable the desired capacitor applications for both the military and for American economic competitiveness.

It has been recognized that capacitor structures fabricated using nano-engineered multilayer technology will give the ability to engineer high performance, high energy-density capacitors. Nano-engineered multilayers are characterized by a near-atomic scale and thus, uniquely large interfacial area to volume ratio. Thus, using this technology, capacitor properties can be optimized by material selection, and design of the synthesis process and materials processing.

Multilayer materials are widely known in the materials community for scientific study and physics applications. Their use has been demonstrated widely. For example, see U.S. Pat. Nos. 4,673,623 issued Jun. 16, 1987 to D. S. Gardner et al.; 4,870,648 issued Sep. 26, 1989 to N. M. Ceglio et al., and 4,915,463 issued Apr. 10, 1990 to Troy W. Barbee. In addition, multilayer thin films have been deposited using a magnetron sputter deposition process described and claimed in copending U.S. application Ser. No. 07/666,971, now U.S. Pat. No. 5,203,977 filed Mar. 11, 1991, and assigned to the same assignee.

Various sputtering techniques have been developed, and such are exemplified by U.S. Pat. Nos. 4,049,533; 4,183,797; 4,392,939; 4,417,968; 4,421,628; 4,915,805; 5,021,139; and 5,022,978.

Sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes must be reversed at very high frequencies to prevent the formation of a positive charge on the cathode that would stop the ion bombardment process. Since the electrode polarity is reversed at a radio frequency of 13.56 MHz, this process is referred to as RF-sputtering.

Magnetron sputtering is a more effective form than diode sputtering that uses a magnetic field to trap electrons in a region near the target surface creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

Ion bombardment not only causes atoms of the target material to be ejected, but also imparts considerable thermal energy to the target. Consequently, any target attachment scheme must provide for good physical contact to the cathode assembly to allow adequate thermal transfer of the target's heat to the cooling media or away from the sputtering source. This is particularly true in the case of magnetron sputtering where very large ion currents are produced causing a very intense and localized heating of the target.

Various means have been used in the past for holding sputter targets in place within the sputter sources. Commercially available sputter coating target cathodes today are either bonded directly to the cathode assembly or secured using various mechanical means. The method used to attach the sputter target to the cathode assembly will also greatly affect the size and overall design of the magnetron sputtering source, the amount of down time when changing targets, and the overall performance of the source. By also eliminating the need for a cooling fluid, the miniaturization of the magnetron sputtering apparatus becomes feasible, and the cost of building the sputtering apparatus becomes more economical.

A co-pending U.S. application, Ser. No. 07/962,657, now U.S. Pat. No. 5,286,361 filed Oct. 19, 1992, now U.S. Pat. No. 5,286,361, issued Feb. 15, 1994 assigned to the assignee of this invention, discloses and claims a method and assembly for attaching sputtering targets to cathode assemblies using a magnetically permeable material imbedded in the base portion of the sputter target. Target attachment to the cathode is achieved by virtue of the permanent magnets and/or pole pieces that create magnetic flux lines adjacent to the backing plate, which strongly attract the magnetically permeable material in the target assembly. Also, copending U.S. Application Ser. No. 08/005,122 filed Jan. 15, 1993, now U.S. Pat. No. 5,333,726, issued Aug. 2, 1994, assigned to the same assignee, describes and claims an improved magnetton sputtering source that is compact, versatile, and less costly to manufacture and operate than prior art sputtering sources.

While other sputtering techniques may be used, magnetron sputtering sources being developed or now in use are deemed to provide more efficient operation and are computer controlled to enable the deposition of this (submicron) layers.

From the prior art it is recognized that all magnetron sputtering sources have four basic design features. First, they all contain a directly cooled and electrically isolated cathode assembly that supports the sputter target and contains the permanent magnet assembly.

Second, a ceramic or polymer insulator electrically isolates the cathode assembly from ground. The insulator structure also establishes the vacuum compatibility of the source by way of ceramic-to-metal braze joints or elastomer O-ring seals.

Third, only a portion of the power in the sputtering process is consumed by ejecting near surface atoms by ion bombardment. Most of the power contributes to thermal heating of the sputter target and the cathode assembly. The excess heat generated is removed by circulating water or another cooling media in the cathode assembly.

Fourth, the sputtering process should be confined to the target surface by using sputter shields that prevent all other exposed surfaces of the cathode assembly and/or target attachment hardware from also being sputtered. This is a necessary requirement if contamination is to be avoided.

Sputter deposition of refractory oxide compound films of high quality from compound targets is difficult as a result of the low mechanical integrity of such targets, their low thermal conductivities, inherently low deposition rates, poor stoichiometry control, and the often substantial contamination incurred during the sputter target preparation. These difficulties may be diminished by reactive sputtering in which the target, consisting of the metal component, is sputtered using a gas mixture consisting of an inert gas (typically argon) and a reactive component, one element of which is active in the formation of the desired compound. Despite present drawbacks associated with a difficulty in closely controlling film stoichiometry, reactive sputtering yields much higher quality films at deposition rates somewhat higher than those attained using compound targets.

The purpose of the program under which this invention arose was to develop a reactive deposition synthesis process with which refractory oxides of controllable structure and composition could be formed in a reproducible and routine manner at substantially increased rates. The studies on the reactive deposition of the oxides of titanium and zirconium ($TiO_x$, $ZrO_x$) have been reported. Films of $TiO_x$ and $ZrO_x$ ($0<x<2$) were synthesized at high rates onto substrates held at room temperature. A systematic investigation of the structure-composition-synthesis process variables was conducted for these systems, and it was clearly demonstrated that films of controllable stoichiometry, varying over the range Ti, $ZrO_{0.1}$, to Ti, $ZrO_2$, can be reproducibly synthesized at rates (5 Å/sec) equal to or greater than those typically encountered in industry. In addition, the substrate temperature during synthesis was close to the ambient ($T_s=65°$ C.). The low temperature nature of this process is a unique feature of high industrial potential, as it provides a method for forming refractory oxide materials (Ti, $ZrO_x$ films) that does not require elevated temperature cycling which could degrade any other existing materials performance.

The experimental approach of the above-referenced studies was 10 based on the concept that isolation of the reaction between the sputtered vapor species (Ti, Zr in this case) and the reactive gas ($O_2$) to the substrate deposition surface would increase the oxide deposition rate and increase reproducibility as the oxidation reaction characteristics at that position are not plasma affected. High deposition rates are attainable as they are determined by the deposition rates of the metal component which are often at least an order of magnitude higher than their oxide. Control of structure and stoichiometry would be attainable through control of the relative rates of incidence of the two reactive components onto the deposition surface and the fact that the local environment at the deposition. Also, if such control was realized, it would facilitate both modeling of the reactive deposition process and enhance experimental reproducibility in both a given laboratory and between laboratories.

The experimental arrangement used was designed to isolate the sputter-source plate from the oxygen gas, maintaining it in an inert argon gas atmosphere while introducing an oxygen pressure at the substrate. An apparatus designed so that a range of oxygen pressures at the substrate could be maintained and that the distribution of oxygen at the deposition surface would be uniform was developed. A gas ring sources for oxygen, was fabricated with the gas inlet in consisting of slits 0.01 in. wide on the inner diameter of a two-piece annular structures. The substrate was mounted in the ring with the oxygen directed down toward and across the substrate surface. Argon was introduced into the ground shield of the sputter source resulting in an argon stream flowing across the sputter target surface. Acceptable film uniformity both in thickness and composition was attained with this apparatus. The general oxygen pressure varied from 0 to 0.6 mtorr (0.08 Pa) in the total system, considerably lower than the oxygen pressure at the substrate, which has not been measured in these experiments.

The experimental results demonstrate that the synthesis of M-oxygen films under controlled conditions, designed so that reaction between M and oxygen occurs at the deposition surface, allows formation of films of reproducible stoichiometry and high uniformity onto room temperature substrates. In our experiments, a dynamic moving surface, in which both silicon and oxygen are supplied to a moving surface (i.e., where a film is being grown) is studied.

The relationship between coverage and exposure is similar to the relationship between composition and relative rates of incidence. A more direct comparison can be made if our data are displayed in terms of the oxygen concentration given as x in $MO_x$, and a dynamic exposure $L_d$. The correspondence between coverage and x in MOx, is clear if we assume that the absorbed species is O, and that unit coverage is attained when there is one x oxygen atoms absorbed for each M surface atom. Dynamic exposure $L_d$ is defined by the time necessary to deposit a monolayer of M atoms and is used in the calculation of oxygen exposure at pressure P. The number of atoms on an exposed metal surface is calculated to be $\sim 3.96 \times 10^{15}/cm^2$. The rate of incidence of M atoms is given as the film thickness deposited per unit time divided by the atomic volume of M.

Thus, a dynamic exposure $L_d$ for oxygen can be defined as $$L_d = P_o \tau$$

where $P_o$, is given in torr and $\tau$ in seconds. During a steady-state synthesis experiment, static exposure and dynamic exposure are analytically equivalent at small time steps.

A series of experiments, in which the reaction between oxygen and M during reactive sputtering is forced to occur at the deposition surface, has been performed and analyzed. A suitable technique was developed for isolating the magnetron sputter source from the ambient oxygen and $MO_x$, films over the complete range of stoichiometry, $O<x<2$, prepared. These films were of excellent uniformity in both thickness and index of refraction.

A sticking coefficient for oxygen of 1.5 to $4 \times 10-3$ was inferred. The sticking coefficient was found to be independent of coverage (i.e., surface stoichiometry). An appropriate model was deduced to be physisorbed oxygen in a mobile precursor state prior to chemisorption. Such a model yields a consistent explanation of the temperature dependence of the stoichiometry of reactively sputtered oxides in general and $MO_x$, in particular. These results demonstrate that fundamental information concerning the interaction of oxygen and various elements is accessible through systematic reactive deposition experiments in which the reaction is localized to the deposition surface.

Nano-structure or nano-phase multilayer materials are dense, low contamination solids synthesized using atom by atom processes. They are characterized by a high concentration of material interfaces. The most notable of such materials as semiconductor superlattices fabricated using molecular beam epitaxy (MBE). However, multilayers may be synthesized using elements from all parts of the Periodic Table Using MBE, evaporation, sputtering and electrochemical deposition technologies. At this time, multilayer structures have been fabricated by physical vapor deposition from at least 75 of the 92 naturally occurring elements in elemental form, as alloys or as compounds. The structure of multilayer materials is determined in synthesis by control of the thicknesses of the individual layers during deposition. These thicknesses vary from one monolayer (0.2 nm) to thousands of monolayers ($>1000$ nm).

Until recently, the macroscopic thickness of nano-structure multilayer materials has been generally limited to less than a few microns, and more typically to 0.5 $\mu m$ or less. Recently, processes for magnetron sputter deposition of thick macroscopic nano-structure multilayer materials have been developed and used to fabricate free standing high quality structures up to 300 $\mu m$ thick containing up to 50,000 individual layers. Existing research synthesis systems produce samples having periods uniform to 2% of the individual layer thickness and areas of $\sim 400$ cm$^2$. These macroscopic nano-structure multilayer samples enable use of standard diagnostic techniques for material property characterization and open a path to develop devices with performance that approaches theoretical limits.

The through film and lateral perfection of these macroscopic multilayer materials have been determined using surface roughness measurements, cross-section transmission electron microscopy (TEM) and standard x-ray diffraction analysis. The surfaces of macroscopic multilayers ($t>20$ $\mu m$) have demonstrated surface perfection essentially equal to the substrate roughness: multilayers deposited on super polished substrates with roughness of $\sim 0.02$ nm RMS and 0.14 nm peak to valley (PV) had roughness of $\sim 0.04$ nm and 0.29 nm PV. Cross-section TEM shows that the multilayer structure $\sim 17$ $\sim$ m from a substrate is identical to that 1 $\mu m$ from that same surface and that this uniformity extended laterally over several microns. X-ray analysis demonstrates that the multilayer period of a 5 nm period 25 $\mu m$ thick free standing structure varied by less than 1% top to bottom through 10,000 individual layers and is constant over 10 cm on single substrates. The perfection shown by these characterization results is unique in that it is atomic in scale but extends over macroscopic distances. These materials exhibit exceptional application specific performance as a result of their nano-structures and atomic distributions. Structural flaws that characteristically limit performance are controlled so that the full potential of the nano-structure multilayer materials is achievable.

The limited performance of the state-of-the-art capacitors is overcome by the present invention, which, as pointed out above, is based on the recognition that capacitor structures could be fabricated using existing nano-engineered multilayer technology. The advantages to fabrication of high energy-density capacitors by multilayer synthesis technologies include: 1) a wide range of materials and thicknesses may be used, 2) the structures are thermally and mechanically robust, 3) the layers are very smooth, and 4) the materials are pure, homogeneous, and defect-free. Thus, capacitors made in accordance with the present invention will be able to satisfy the above-referenced needs for pulse power and industrial applications.

SUMMARY OF THE INVENTION

An object of the present invention is to provide a capacitor which is inherently solid state and exhibits extraordinary mechanical and thermal properties.

A further object of the invention is to provide a capacitor fabrication technique capable of laying down extraordinary smooth submicron layers of dielectric and conductor materials.

A further object of the invention is to provide high performance, high energy-density capacitors using nano-structure multilayer materials technology.

Another object of the invention is to provide a nano-structure multilayer series-parallel capacitor bank.

Another object of the invention is to provide a nano-structure multilayer capacitor having tapered conductors to manage the current density, thereby reducing the weight and bulk thereof.

Another object of the invention is to provide a method for fabricating multilayer capacitors having uniformity of the layers and smooth interfacial quality.

Other objects and advantages will become apparent from the following description and accompanying drawings. Basically, the invention involves the fabrication of high energy-density capacitors by nano-engineered, multilayer synthesis technologies, whereby the materials, thickness of layers, interfacial quality, and conductor configuration can be precisely controlled. An example of a capacitor made in accordance with the present invention can deliver at least 5 MJ in about 15 ms to a load that exhibits significant inductive reactance, with a repetition rate of one shot every 10 seconds, along with a lifetime of thousands of shots. The individual capacitors can be readily connected in series and/or parallel to produce large capacitor banks capable of satisfying to above-referenced pulse power and industrial application requirements.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
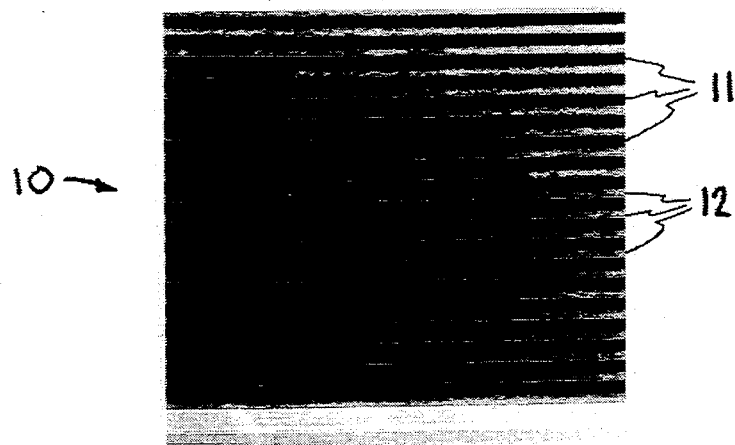
FIG. 1 is a cross-section transmission electron micrograph of a multilayer having a periodicity of 135 Å and at a magnification of 200,000×, illustrating the uniformity of layers and interfacial smoothness.

The present invention is directed to high performance, very high energy-density capacitors fabricated by using nano-structure multilayers of dielectric and conductor materials deposited atom-by-atom to form multiplate capacitors with very large area-to-surface ratios. High voltage holdoff is maintained by the following:

1. Purity and perfect atomic structure of the dielectric material layers.
2. Flatness and smoothness of the layers, conductor-dielectric and dielectric-dielectric interfaces.
3. Multiple dielectric-dielectric interfaces.
4. Dielectric distances much less than the mean-free paths of electrons.
5. Management of the conductor edge effect and diffraction of the high stress electric field in the dielectric to avoid avalanche breakdown.
6. Fabrication technology which allows very wide range of materials to be applied in capacitors.

Other strategic advantages of applying nano-structure multilayer technology to making high performance, high energy-density capacitors include:

1. Ability to engineer and design the capacitor geometries to the application and form-factor of interest, resulting from flexibility of the fabrication process.
2. Very high efficiency; low equivalent series resistance (ESR) loss.
3. Very low equivalent series inductance (ESL).
4. Tapered conductors to maintain constant current density and avoid conductor melting as predictable by the action integral for a given application.
5. Near net form fabrication.
6. Solid state construction with excellent mechanical and thermal properties.
7. Solid state construction easily integrated with the application.

Thus, by applying controlled, reactive sputtering and related techniques for making nano-structure multilayer materials, capacitors can be designed and fabricated with very high energy-density, high specific energy, and high voltage breakdown, as well as satisfactory pulse repetition rate and shot life for pulse power applications. By fabricating capacitors using nano-structure multilayer materials, extraordinarily flat and smooth layers of dielectric materials can be deposited in submicron layers with similarly thin layers of conductive material to form a large surface area, multiplate capacitors with high performance characteristics. The capacitors of this invention are well suited for pulse power and other applications requiring low loss, low inductance and rugged, highly integrated construction. Thus, the nano-structure, multilayer capacitors of this invention provide the required storage and rapid, efficient discharge of significant electrical energy for electrothermal systems, railguns, electromagnetic effects systems, pulse lasers, weapons detonation, x-ray generation, and other pulse power applications be developed under government programs. These capacitors also satisfy the new commercial applications requiring high precision, high performance, and high energy-density electrical energy storage needed for space and other remote applications, medical systems (e.g. implants), high precision instrumentation, and highly reliable electronics. Also, the capacitors have application in electric-hybrid vehicles, power applications, and integrated power supplies.

There are several potential advantages inherent to fabrication of high energy density capacitors by multilayer synthesis technologies. First, the processes used are generic in that a wide range of materials may be deposited as thin films. Therefore, it will be possible to apply new materials as they are developed potentially enhancing the dielectric properties of the insulating spacer (i.e., technology insertion). The embodiments presented hereinafter are based on a simple dielectric, amorphous $SiO_2$, with a dielectric constant of k=3 and a maximum standoff field of $V_b$=1.2 —to— $1.4 \times 10^7$ V/cm. Enhanced performance can be expected if dielectrics $ZrTiO_3$ (k=20 to 25), $TiO_2$ (k=70 to 80), or $CaTiO_3$ (k=140 to 150) are applied. Also ferroelectric material, such as barium titanate ($BaTiO_3$) with (k=2000-4000) may be used. Standoff fields of these materials in thin film form are not currently well known but are expected to be substantially larger than those observed for commercial bulk materials formed using powder compaction/sintering processing ($\sim 10^5$ V/cm). This opinion is based on current ability to fabricate fully dense layers having controlled surface roughness less than 5 Å on a routine basis. This is demonstrated in FIG. 1 where a cross-section transmission electron micrograph of a molybdenum-silicon multilayer generally indicated at 10, having a periodicity of 135 Å, is shown at a magnification of 200,000×, with the molybdenum shown as the dark lines 11 and the silicon shown as the light lines 12. Note the uniformity of the layers and the interfacial quality; the interfaces in this structure are smooth to approximately 1 to 2 atomic diameters (2 to 4 Å). Second, these structures are thermally and mechanically robust. Strengths approaching the theoretical limits of the component materials in metal/metal multilayers have been experimentally demonstrated for several alloy systems. Also, these materials are observed to be stable in multilayer form to temperatures in excess of 500° C. in most cases. Thus, nano-engineered multilayer structures have several strategic advantages in developing high performance capacitors.

There are also manufacturing advantages. It is possible to design and fabricate a capacitor structure to near net form. This manufacturability and the atom-by-atom nature of the deposition processes can facilitate engineering design. The conductor structures can be formed in a variety of configurations allowing applications-specific geometries and sizing to minimize anticipated capacitor performance limitations.

Figure 2:
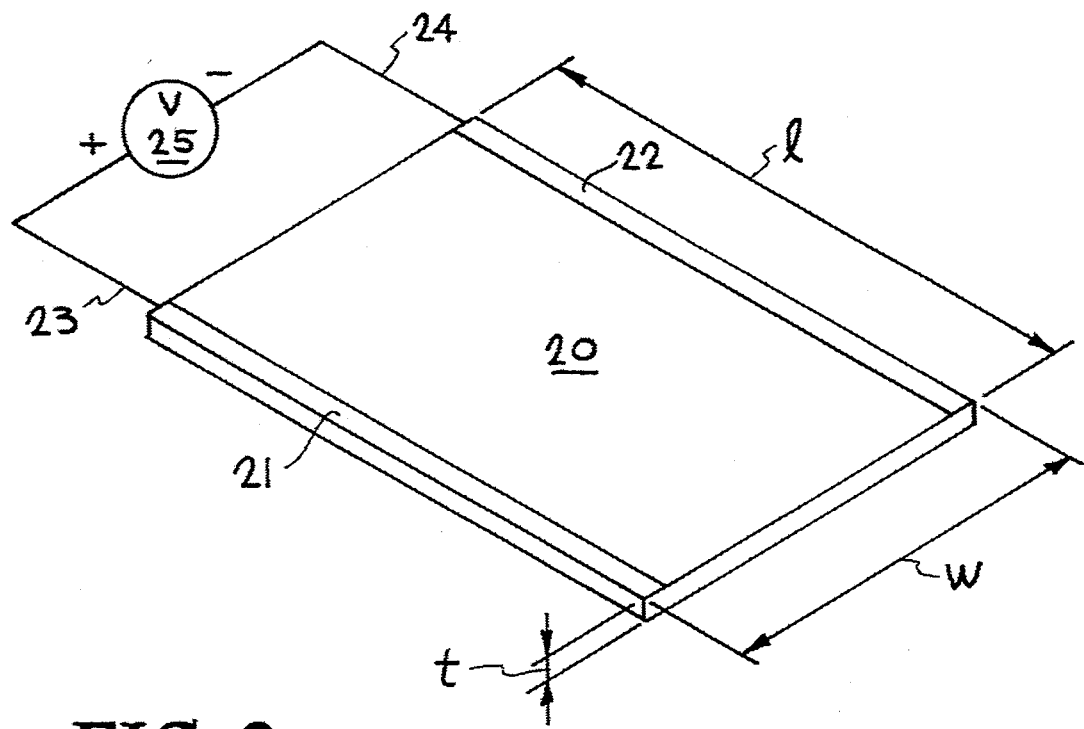
FIG. 2 is a perspective view of a "notepad" capacitor embodiment made in accordance with the invention.
Figure 3:
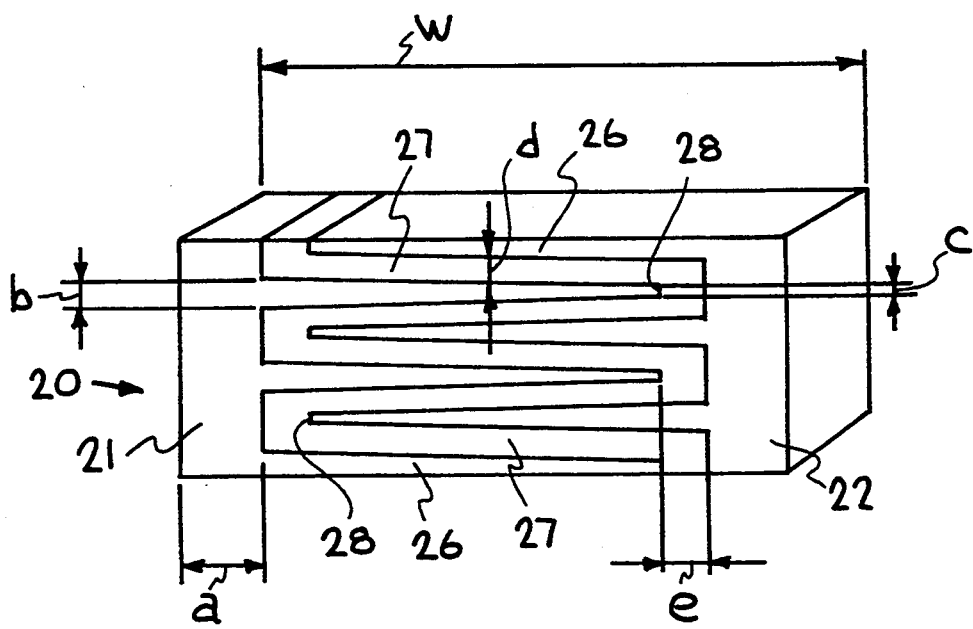
FIG. 3 is an enlarged, partial cross-sectional view of the FIG. 2 "notepad" capacitor illustrating conductors with a tapering cross-section.

FIGS. 2 and 3 illustrate an embodiment of a multilayer capacitor which is a conceptual engineering design for verification of this invention. The embodiment addressed a pulse power application typical for electromagnetic propulsion. The design goal was to deliver at least 15 MJ in about 15 ms to a load that exhibits significant inductive reactance. A moderate repetition (rep) rate, on the order of one shot every 10 seconds was required, along with a lifetime of a thousand shots or better. Efficiency was to be high to obviate the need for an elaborate cooling system.

A configuration or form factor that is amenable to multilayer fabrication techniques is analogous to a thin notepad, roughly 8.5 by 11 inches (200 by 300 mm), and 1 mm thick. Thus, the embodiment illustrated in FIGS. 2 and 3 is referred to as a "notepad" capacitor, with the nano-engineered, multilayer body or element indicated generally at 20 having a length (l) of 300 mm, a width(w) of 200 mm, and a thickness(t) of 1 mm. Terminals or tabs, such as copper strips 21 and 22, are located on opposite sides of the capacitor body 20, and are suitable for brazing which guarantees low contact resistance and high durability. The terminals 21 and 22 constitute positive and negative contacts which are electrically connected via leads 23 and 24 to a voltage source 25. While not shown in FIG. 2, the capacitor body 20 is composed of numerous alternating layers of conducting and dielectric materials, such as copper (Cu) and silicon dioxide ($SiO_2$), as seen in FIG. 3. The number of layers may vary from a relatively few (10–100) to several thousand (3000), depending on the application for which the capacitor is being designed.

The FIG. 3 cross-section of the FIG. 2 notepad capacitor element 20 shows the terminals or tabs 21 and 22 being integral with conductive layers or strips 26, between which is located dielectric layers 27. The conductive layers 26 are copper (Cu) and the dielectric layers 27 are amorphous silicon dioxide ($SiO_2$). The dielectric of this design embodiment was chosen because the properties of $SiO_2$ are well known. However, other non-ferroelectric materials with better dielectric constants, such as titanium dioxide ($TiO_2$), calcium titanate ($CaTiO_3$), or zirconium dioxide ($ZrO_2$) and fero-electric materials such as barium titanate ($BaTiO_3$) may be used, and aluminum (Al) for example may be used as the conductive layers. The characteristics of $SiO_2$, used in this design embodiment are:

Breakdown voltage: $7 \times 10^8$ V/m (17.8 KV/mil)
Dissipation factor (Tan δ): $7 \times 10^{-4}$
Relative permitivity (k): 3.0

The breakdown voltage, in particular, is a conservative value. Because of the very thin layers that are proposed, breakdown performance modes are expected to improve. One such effect, avalanche breakdown, should be reduced because of rapid electron recapture. The dissipation factor is about 50 times lower than that of paper/oil dielectrics found in the most commonly-used high energy capacitors. Though it is a relative low-k material, $SiO_2$ is also free from dipole losses and the high effective resistance of high-k ferroelectric ceramics like $BaTiO_3$. In applications where high capacitance is the most important factor, high-k materials could certainly be used.

FIG. 3 illustrates another engineering advantage of the multilayer fabrication technique, wherein the conductors 26 are tapered and have ends 28, but need not be tapered. Since the current density in any plate is proportional to the distance from the end of the electrode, the required cross-section of the conductor can also vary proportionally. This reduces the amount of copper in the assembly, saving weight and bulk. The minimum practical thickness for copper deposition is about 0.1 μm and the maximum thickness is about 1.0 μm.

By way of example and as shown in FIG. 3, the capacitor element 20 has a width (w) of 200 mm, with the terminals or tabs 21, 22 having a width (a) of 1 mm, conductors 26 having a thickness (b) adjacent tabs 21, 22 of 0.2 μm and thickness (c) at the tip 28 of 0.1 μm, with the dielectric layers 27 having a thickness (d) of 3.75 μm, and with the tip insulation (distance from conductor tip 28 to tabs or terminals 21, 22) having a distance (e) of 100 μm.

In ordinary foil capacitors, breakdown at the edges of the foils is a nagging problem. In design embodiment of this invention, the edges, or plate tips, are completely buried in the multilayer dielectric. Multilayer dielectric material can be engineered to offset the electric field gradient and reduce edge effect, improving capacitor voltage breakdown characteristics.

Capacitance for one layer of this parallel-plate capacitor is calculated from $$C = k\epsilon_o \frac{a}{d}$$

where C is the capacitance in Farads, k is the relative permitivity (3.0 for $SiO_2$), $\epsilon_o$ is the permitivity of free space ($8.854 \times 10^{-12}$ F/m), a is the plate area and d is the dielectric thickness. Notepad capacitor structures with the dimensions in FIG. 3 and 256 layers have capacitance C=109 $\mu$F and a breakdown voltage $V_b$=2,600 V. Copper accounts for 4% of the volume and 11% of the mass of this capacitor. Minimizing the quantity of copper maximizes the volume of dielectric, improving energy density.

Energy stored in a capacitor is calculated from $$W = 1/2CV^2 = 1/2k\epsilon_o \frac{a}{d}$$

where W is the energy in Joules, and V is the voltage. The notebook capacitor can store 368 J if it is charged to its breakdown voltage. When designing a capacitor, it is apparent that dielectrics with high-k and high breakdown voltage increase energy density, but there may be other tradeoffs: dielectric absorption (loss), capacitance changes with voltage and temperature, thermal conductivity, mechanical properties, etc., all affect the choice of the dielectric material.

Figure 4:
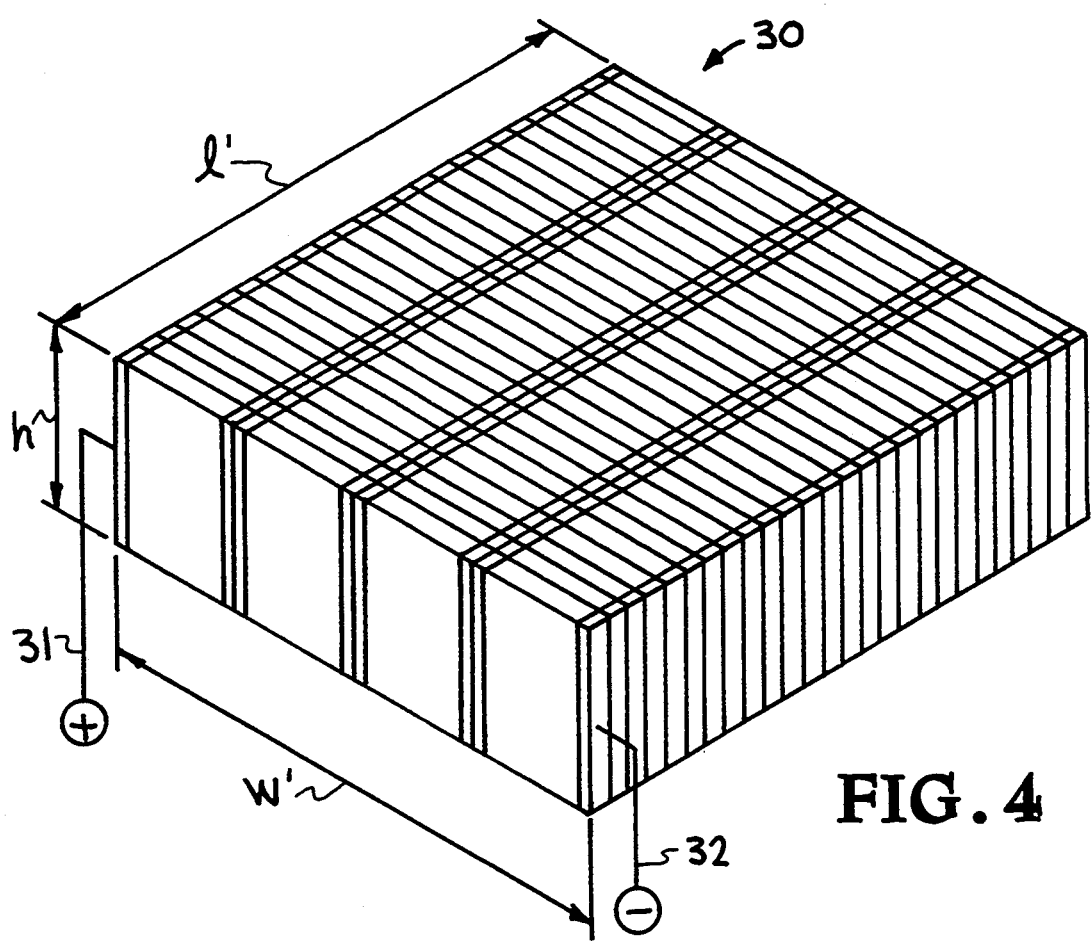
FIG. 4 is a perspective view of a series-parallel bank of the "notepad" capacitors of FIG. 2.

FIG. 4 illustrates an embodiment of a capacitor bank using the "notepad" capacitor of FIGS. 2 and 3. This embodiment of the capacitor bank, generally indicated at 30, was designed for a 20 KV, 6 MJ series parallel bank of 16,800 notepad capacitors, each having the above-described characteristics. As shown in FIG. 4 the bank 30 has a length (l') of 2.1 m (2,100 notepad capacitors), a width (w') of 1.6 m (8 notepad capacitors), and a height (h) of 0.3 m (300 mm), with positive and negative terminals or tabs as indicated at 31 and 32.

The specifications of the designed capacitor bank embodiment 30 illustrated in FIG. 4 are set forth in the following table:

Volume: 1.0 m³
Capacitance: 0.03 F
Working Voltage: 20 KV
Energy Storage: 6 MJ
Weight: 3000 Kg
Energy Density: 6 MJ/m³
Specific Energy: 2 KJ/Kg
Effective Series Resistance: 0.3 mΩ

To examine the efficiency of this capacitor bank, a simplified model of an electromagnetic propulsion (railgrin) application was devised, represented by an RL load with R=0.2Ω and L=2 mH. This initial charge was 20 KV, 6 MJ. With these conditions, the expected voltage ringdown occurred with voltage reversal at 17 ms. Losses in the capacitor bank include 3 KJ of $I^2R$ loss in the conductors and 6 KJ of dielectric loss, for a bank efficiency of 99.85% (see table below). In a practical system, much more energy would be lost externally in a resistive crowbar circuit that is required to prevent voltage reversal and quench any arcing on the railgun.

Resistive Loss: 3 KJ
Dielectric Loss: 6 KJ
Bank Efficiency: 99.85%
Heating Per Shot: 0.007° C.

Little heating of the bank (a 0.007° C. rise per shot) would occur because of its high efficiency and high heat capacity. The heat capacities of the capacitor materials relative to water (water=1.0) are 0.54 for $SiO_2$ and 0.89 for copper. Use of thin layers also promotes rapid thermal diffusion, preventing internal stress. This is very favorable for high repetition rate applications. It is feasible to build in liquid cooling channels if different geometries of materials that require cooling were used.

The embodiments of FIGS. 2–4 use well-understood materials for capacitor application. High energy density, low loss, good thermal and mechanical properties, and low inductance make the nano-structure multilayer capacitor of this invention an excellent candidate for military pulse power applications, as well as for industrial application. The controlled sputtering techniques are capable of laying down extraordinarily smooth sub-micro layers of dielectric and conductor materials. Capacitors developed by the nano-structure multilayer technique are inherently solid state, thus exhibiting extraordinary mechanical and thermal properties. Further, this method of fabrication enables the capacitors to be engineering designed as to materials used and the thickness and configuration of the various layers.

While the magnetron sputtering technique is known, the following sets forth an example the operation steps carried out to produce the "notepad" configuration of the embodiment of FIGS. 2 and 3 using copper as the conducting material and silicon dioxide as the dielectric material:

1. Using a copper target in a 2 mTorr argon atmosphere and a magnetron source (DC powered to 600 watts and operating voltage of 700–750 V with current of 0.9 amps), the conducting electrode layer (copper) is deposited on a substrate, such as float glass, at a deposition rate greater than 30 Å per second to a thickness of 0.1–0.2 $\mu$m, (1000 Å) for example, using a deposition time of 30–70 seconds. It is desired to maintain the substrate temperature at 40°–50° C. during processing.

2. Mask the thus deposited copper layer for electrode geometry, using nickle alloy as the maskant.

3. Position masked electrode in a second source using an argon atmosphere at 3–4 mTorr for depositing the dielectric layer.

4. Deposit the dielectric (silicon dioxide) by reactive sputtering on the non-masked areas of the copper layer by magnetron sputtering in a reactive gas ($O_2$ at 0.5–1.0 mTorr), providing a deposition rate of 8 Å/sec. and thickness of 0.5 $\mu$m. This allows control of pressure at substrate stoichiometry of deposited dielectric to be controlled. Where $ZrO_2$ and $TiO_2$ are used as the dielectric, the deposition rates are 1.56 and 1.78 times deposition rate of metal atoms (30 Å/sec.).

5. The maskant is removed, and the electrode is again placed in the first source (or an equivalent third source).

6. A different maskant is applied to put on a counter electrode, whereafter a layer of copper is applied.

7. The electrode is returned to the second source (or an equivalent fourth source).

8. An appropriate masket is applied to enable deposition of a second layer of dielectric is deposited.

9. Thereafter the electrode is moved between sources and masked to provide the desired layers of copper and dielectric.

It should be noted that the substrate quality is important, high quality thin-uniform substrates with roughness of less than 1/20 of the thickness of the thinnest layer is preferred.

Figure 5:
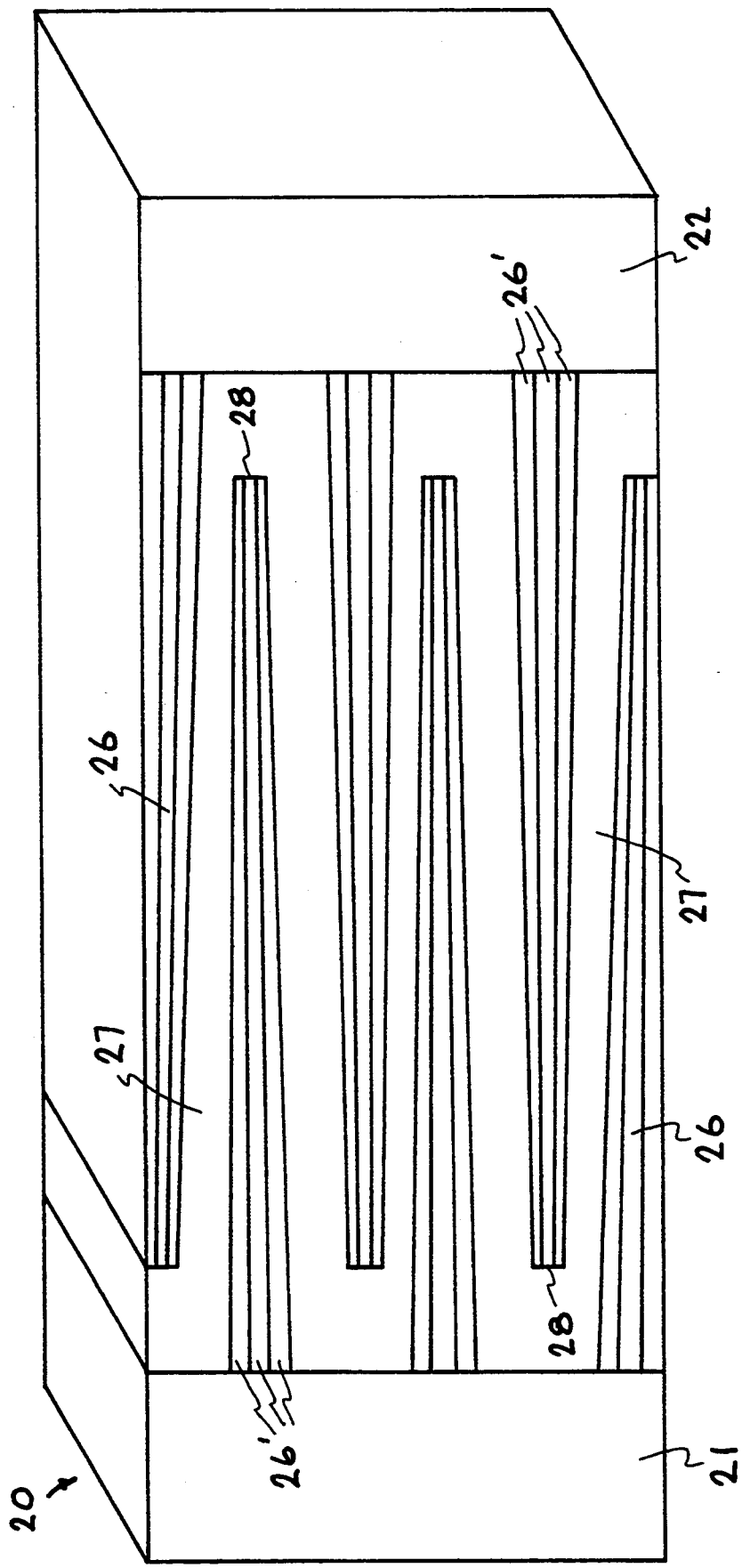
FIG. 5 is a view of the FIG. 3 embodiment showing layers of the conductive material as composed of a plurality of sublayer.

FIG. 5 illustrates a partial enlarged embodiment similar to FIG. 3 but wherein the conductive material layers 26 are composed of multiple sublayers of conductive material indicated at 26', and which are in contact with terminals 21 and 22.

It has thus been seen that the present invention provides a fabrication method having the following manufacturing, functional and performance advantages:

1. Any given dielectric layer may be composed of multiple sublayers of different or similar, alternating or otherwise varying dielectric or non-interconnected (floating) conductive material. The floating conductive sublayers act as equipotential planes to defer avalanche breakdown between any two points on the positive and negative conductor layers under high-voltage, high-stress conditions. They also serve to manage the electric field gradients around the edges of the conductor layers.

2. Any given conductive layer may be composed of multiple sublayers of conductive material according to the capacitor design to manage discharge current density and the work function at the dielectric-conductor interface.

3. Individual dielectric layers in a given capacitor design may be fabricated with different dielectric materials or different combinations of dielectric materials as needed to provide the desired performance with varying temperature, frequency or discharge time, voltage and charge. Engineered nanostructure multilayer capacitors may use different mixes of dielectric materials, each with its own temperature coefficient and frequency response, in different dielectric layers to provide the desired capacitor response.

4. Systems of interconnected or non-interconnected capacitors may be fabricated for use as fundamental integrated components for power supplies, power electronics, power distribution busses, electronics packaging, printed circuit boards, integrated circuit packaging, and circuit interconnect in integrated circuits.

5. A dielectric switch may be designed as an integral part of the capacitor to provide a controlled avalanche breakdown to discharge all or part of the capacitor or bank of capacitors. Nanostructure multilayer capacitors with integrated dielectric switch may be used as one-shot devices, such as for explosive fusing, and similar destructive applications.

6. Fabrication of large, flat capacitors enables interconnect of two or more of these capacitors, in any series-parallel combination, for dense packing and short conductor length for reduced inductance and resistance.

While a specific embodiment of the capacitor and capacitor bank made in accordance with the present invention have been illustrated and described, and a specific fabrication operational sequence has been described, such are not intended to limit the invention, but to set forth the principle on which the invention is based. Modifications and changes will become apparent to those skilled in the art, and it is intended that the scope of the invention be limited only by the scope of the appended claims.

We claim:

1. A capacitor comprising:
   a plurality of submicron thick layers of a conductive material;
   said layers of conductive material being continuously tapered in cross-section along a length thereof;
   a plurality of layers of a dielectric material;
   one of said layers of dielectric material being intermediate adjacent layers of said conductive material;
   said layers of dielectric material being interconnected; and
   conductive terminals operatively connected to said layers of conductive material.

2. The capacitor of claim 1, wherein said plurality of layers of dielectric material are interconnected so as to form a continuous serpentine dielectric barrier between said plurality of layers of conductive material.

3. The capacitor of claim 1, wherein said plurality of layers of conductive material are interleaved with at least one of said interleaved layers of conductive material being connected to one of a plurality of said conductive terminals.

4. The capacitor of claim 1, wherein each of said plurality of layers of conductive material is composed of a plurality of sub-layers of conductive material operatively connected to a conductive terminal.

5. The capacitor of claim 1, wherein certain of said plurality of layers of conductive material are connected to one of said conductive terminals, wherein certain of said plurality of layers of conductive material are connected to another of said conductive terminals, wherein said plurality of layers of conductive material connected to said conductive terminals are interleaved, spaced from one another, and spaced from an opposite conductive terminal, and wherein said plurality of layers of dielectric material are interconnected to form a continuous serpentine dielectric barrier between said plurality of layers of conductive material and between said layers of conductive material and said opposite conductive terminals.

6. The capacitor of claim 1, wherein said plurality of layers of conductive material comprises at least two such layers attached to each of said conductive terminals so as to define two sets of interleaved conductive layers, with terminal ends of said layers of one set being in spaced relation to the conductive terminal of another set, and wherein said plurality of layers of dielectric material extend between said interleaved conductive layers and are interconnected at the space formed intermediate said terminals ends of said conductive layers and said conductive terminal.

7. The capacitor of claim 1, wherein said conductive material is selected from the group consisting of copper, aluminum, zirconium, and titanium, and wherein the dielectric material is selected from the group consisting of silicon dioxide, titanium dioxide, calcium titanate, zirconium dioxide, barium titanate.

8. The capacitor of claim 1, wherein each of said layers of conductive material is integral with a conductive terminal.

9. The capacitor of claim 1, wherein one end of said layer of conductive material has a cross-section of about one-half the cross-section of another end of said layer.

10. The capacitor of claim 9, wherein said conductive material is copper, and wherein said one end of said tapering cross-section has a thickness of about 0.1 $\mu$m.

11. The capacitor of claim 10, wherein said dielectric material is silicon dioxide, and wherein said layers of dielectric material have a cross-sectional distance of about 3.7 μm.

12. The capacitor of claim 11, wherein said terminal are constructed of copper and have a width of about 1 mm.

13. The capacitor of claim 12, wherein said another end of each said tapering cross-section layers of conductive material is integral with a conductive terminal and has a thickness of about 0.2 μm.

14. The capacitor of claim 13, wherein each of said layers of conductive material has one end which terminates in spaced relation to another of said conductive terminals.

15. The capacitor of claim 14, wherein said one end of said layers of conductive material is spaced about 100 μm from an adjacent conductive material.

16. The capacitor of claim 15, electrically connected to a plurality of similarly constructed capacitors to form a bank of such capacitors.

17. A nano-structure multilayer capacitor comprising:
a plurality of conductors having one end thereof electrically connected to one of at least two conductive tabs, each of said conductors having a continuously tapering cross-section along a length thereof; and
a plurality of interconnected dielectric layers, each of said dielectric layers being at least partially located between adjacent conductors and between a second end of said conductors and said conductive tabs.

18. The multilayer capacitor of claim 17, wherein said second end of each of said conductors is of a lesser cross-section than said one end of said conductors.

19. The multilayer capacitor of claim 17, wherein alternate conductors extend from alternate conductive tabs, such that space between said alternate conductors is remained substantially constant along a length of said conductors.

20. The multilayer capacitor of claim 17, wherein said conductors and said dielectric layers are formed in a configuration of a notepad having a length, width and thickness, and include from about 10 to several thousand alternating layers of conductors and dielectric material and with an overall thickness of about 1 mm.

* * * * *